(12) United States Patent
Kinuhata et al.

(10) Patent No.: US 11,557,275 B2
(45) Date of Patent: Jan. 17, 2023

(54) VOICE SYSTEM AND VOICE OUTPUT METHOD OF MOVING MACHINE

(71) Applicant: KAWASAKI MOTORS, LTD., Akashi (JP)

(72) Inventors: Masanori Kinuhata, Kobe (JP); Daisuke Kawai, Kobe (JP); Shohei Terai, Kobe (JP); Hisanosuke Kawada, Kobe (JP); Hirotoshi Shimura, Itami (JP)

(73) Assignee: KAWASAKI MOTORS, LTD., Akashi (JP)

( * ) Notice: Subject to any disclaimer, the term of this patent is extended or adjusted under 35 U.S.C. 154(b) by 0 days.

(21) Appl. No.: 17/269,149

(22) PCT Filed: May 30, 2019

(86) PCT No.: PCT/JP2019/021572
§ 371 (c)(1),
(2) Date: Feb. 17, 2021

(87) PCT Pub. No.: WO2020/054141
PCT Pub. Date: Mar. 19, 2020

(65) Prior Publication Data
US 2022/0114999 A1    Apr. 14, 2022

(30) Foreign Application Priority Data

Sep. 11, 2018    (JP) .............................. JP2018-169349

(51) Int. Cl.
*G01C 21/00* (2006.01)
*G10L 13/033* (2013.01)
*G10L 25/51* (2013.01)
*G06F 40/35* (2020.01)
*G10L 15/187* (2013.01)
*G10L 15/22* (2006.01)

(52) U.S. Cl.
CPC ............ *G10L 13/033* (2013.01); *G10L 25/51* (2013.01); *G06F 40/35* (2020.01); *G10L 15/187* (2013.01); *G10L 15/22* (2013.01)

(58) Field of Classification Search
CPC ...................................................... G01C 21/00
See application file for complete search history.

(56) References Cited

U.S. PATENT DOCUMENTS 9,077,814 B2 * 7/2015 Lee .......................... H04M 1/00
10,670,417 B2 * 6/2020 Wang .................. G01C 21/3679
(Continued)

FOREIGN PATENT DOCUMENTS

CN    108430818 B  * 12/2021  ............. B60K 28/06
EP    1067682 A2  *  1/2001  .......... G01C 21/3629
(Continued)

*Primary Examiner* — Shreyans A Patel
(74) *Attorney, Agent, or Firm* — Alleman Hall Creasman & Tuttle LLP

(57) ABSTRACT

A voice system of a moving machine is a voice system of a moving machine driven by a driver who is exposed to an outside of the moving machine and includes: a noise estimating section which estimates a future noise state based on information related to a noise generation factor; and a voice control section which changes an attribute of voice in accordance with the estimated noise state, the voice being voice to be output to the driver.

16 Claims, 1 Drawing Sheet

(56) References Cited

U.S. PATENT DOCUMENTS

2012/0268294 A1\* 10/2012 Michaelis ............... G06F 9/451
340/459
2016/0334228 A1 11/2016 Wang
2017/0004827 A1\* 1/2017 Bancalari ................ G06Q 50/06
2020/0037094 A1\* 1/2020 Hosoda .................. G06Q 50/10

FOREIGN PATENT DOCUMENTS

| EP | 1808853 B1 \* | 5/2014 | ............... H03G 3/32 |
| JP | H05265466 A | 10/1993 | |
| JP | 2002091488 A | 3/2002 | |
| JP | 2002314637 A | 10/2002 | |
| JP | 2004048981 A \* | 2/2004 | ............ B60L 3/0046 |
| JP | 2005122042 A | 5/2005 | |
| JP | 2008061113 A \* | 3/2008 | |
| JP | 2013135469 A \* | 7/2013 | ............. H04M 1/00 |
| JP | 2015215528 A | 12/2015 | |
| JP | 2016109498 A \* | 6/2016 | |
| JP | 2018107795 A \* | 7/2018 | ............. B60Q 3/80 |
| WO | WO-2011027437 A1 \* | 3/2011 | ............ G10L 21/04 |

\* cited by examiner

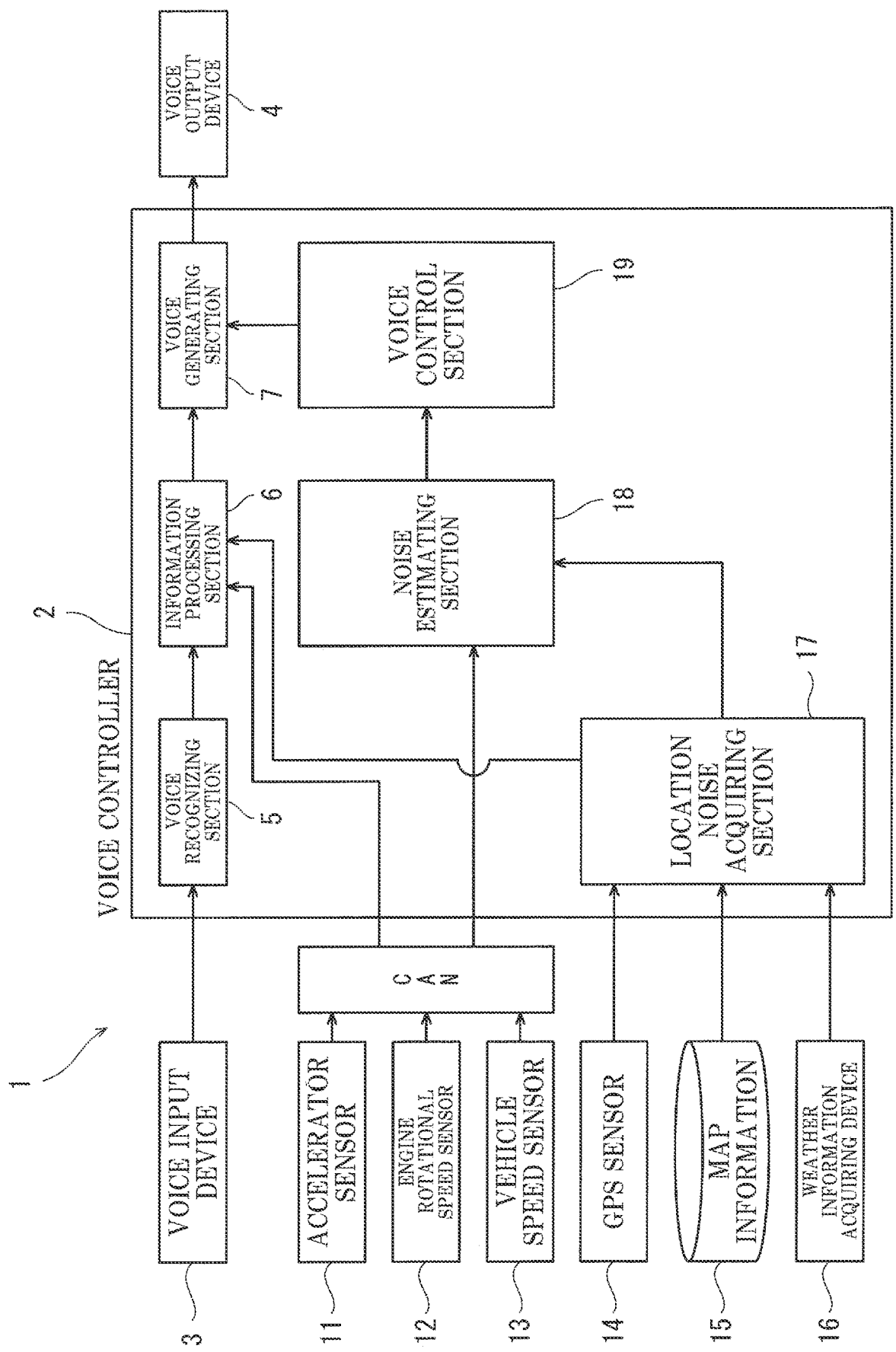

VOICE SYSTEM AND VOICE OUTPUT METHOD OF MOVING MACHINE

TECHNICAL FIELD

The present invention relates to a voice system and voice output method of a moving machine driven by a driver who is exposed to an outside of a vehicle.

BACKGROUND ART

It has been proposed that in a system which provides various kinds of guidance to a driver by voice, a noise level around the system is actually measured, and voice which emphasizes a specific frequency is generated in accordance with frequency characteristics of the input noise (see PTL 1, for example).

CITATION LIST

Patent Literature

PTL 1: Japanese Laid-Open Patent Application Publication No. 2015-215528

SUMMARY OF INVENTION

Technical Problem

However, according to a vehicle, such as a motorcycle, driven by a driver who is exposed to an outside of the vehicle, noise felt by the driver during traveling is relatively large, and a dynamic change width of noise is significant. Since a method of actually measuring noise requires, for example, analytical processing of the noise, response delay of voice generation occurs. When a dynamic change in the noise is significant, delay of voice output with respect to noise acquisition occurs, and this may delay the output of voice which is easy to listen for the driver.

An object of the present invention is to prevent voice mismatch caused by response delay of voice generation with respect to noise and to enable a driver to easily listen to voice.

Solution to Problem

A voice system of a vehicle according to one aspect of the present invention is a voice system of a moving machine driven by a driver who is exposed to an outside of the moving machine. The voice system includes: a noise estimating section which estimates a future noise state based on information related to a noise generation factor; and a voice control section which changes an attribute of voice in accordance with the estimated noise state, the voice being voice to be output to the driver.

According to the above configuration, the noise state is estimated based on the information related to the noise generation factor. Therefore, the future noise state can be predictively known unlike a case where the noise itself is detected. Therefore, even in the case of the driver exposed type moving machine (open type moving machine) in which a dynamic change in the noise state is significant, voice mismatch caused by the response delay of the voice generation with respect to the noise is prevented. With this, the driver can easily listen to the voice and therefore can easily recognize the information indicated by the voice.

The information related to the noise generation factor may be information related to at least one of a generation factor of driving noise generated by the moving machine itself, a generation factor of traveling noise generated when the moving machine travels, and a generation factor of environmental noise generated around the moving machine.

According to the above configuration, the state of the noise based on the sound which largely influences as the noise generation factor in the driver exposed type moving machine can be predictively estimated, and the effect of improvement of the easiness of listening for the driver can be increased more than the other types of noise.

The information related to the noise generation factor may be information related to two or more of the generation factor of the driving noise, the generation factor of the traveling noise, and the generation factor of the environmental noise.

According to the above configuration, the noise state can be predictively estimated based on two or more sound generation factors which largely influence as the noise generation factor in the driver exposed type moving machine, and the effect of improvement of the easiness of listening for the driver can be further increased.

The noise estimating section may estimate a noise level based on the information related to the noise generation factor. The voice control section may change the attribute of the voice in accordance with the estimated noise level.

According to the above configuration, since the attribute of the voice is changed in consideration of the noise level which largely influences the listening of the voice by the driver, the effect of improvement of the easiness of listening for the driver can be increased.

The noise estimating section may estimate a future noise state based on a time change of the noise generation factor. The voice control section may change the attribute of the voice in accordance with the estimated future noise level.

According to the above configuration, since the attribute of the voice is changed based on the predicted future noise state, the influence of the delay of the voice generation can be suppressed, and the effect of improvement of the easiness of listening for the driver can be increased.

The noise estimating section may estimate the noise state based on operation information related to vehicle operation of the driver.

According to the above configuration, since the noise state is estimated based on the operation information of the driver, the change in the driving noise generated by the moving machine itself and the change in the traveling noise generated when the moving machine travels can be estimated, and the influence of the delay of the voice generation can be suppressed. Thus, the effect of improvement of the easiness of listening for the driver can be increased.

The voice system may further include a location noise acquiring section which acquires noise generation information of a location where the moving machine travels. The noise estimating section may determine the noise state in accordance with the noise generation information of the location.

According to the above configuration, the noise can be more suitably estimated in consideration of the noise change caused due to the location where the vehicle travels.

The voice control section may determine a sentence length of the voice as the attribute in accordance with the estimated noise state.

According to the above configuration, natural sound can be maintained as compared to a case where the voice quality is changed. Thus, the easiness of recognition of the voice for the driver can be improved.

A voice output method for a moving machine according to another aspect of the present invention is a voice output method for a moving machine driven by a driver who is exposed to an outside of the moving machine. The voice output method includes changing an attribute of voice based on information related to a noise generation factor, the voice being voice to be output to the driver.

Advantageous Effects of Invention

According to the present invention, the voice mismatch caused by the response delay of the voice generation with respect to the noise is prevented, and the driver can easily listen to the voice.

BRIEF DESCRIPTION OF DRAWINGS

The FIGURE is a block diagram showing a voice system of a motorcycle according to an embodiment.

DESCRIPTION OF EMBODIMENTS

Hereinafter, an embodiment will be described with reference to the drawing.

The FIGURE is a block diagram showing a voice system 1 of a motorcycle according to the embodiment. The voice system 1 is applied to a moving machine (i.e., a driver exposed type moving machine) driven by a driver who is exposed to an outside of the moving machine. In the present embodiment, a motorcycle is described as a suitable example of the moving machine.

The voice system 1 includes a voice controller 2. The voice controller 2 includes a processor, a volatile memory, a non-volatile memory, an I/O interface, and the like as hardware, and the non-volatile memory stores a predetermined voice program. The voice controller 2 may be a control device mounted on the motorcycle. In the present embodiment, the voice controller 2 is a mobile information terminal (for example, a smartphone) provided at the motorcycle. To be specific, the processor, volatile memory, non-volatile memory, I/O interface and the like of the voice controller 2 are incorporated in the mobile information terminal, and the voice program is an application program installed in the mobile information terminal. The mobile information terminal may be carried by the driver of the motorcycle or may be attached to a holder of the motorcycle.

A voice input device 3 is connected to an input side of the voice controller 2, and a voice output device 4 is connected to an output side of the voice controller 2. The voice input device 3 is, for example, a microphone. The voice output device 4 is, for example, a speaker or an earphone. Connection of the voice input device 3 and the voice output device 4 to the voice controller 2 may be wireless connection (Bluetooth (trademark), for example) or wired connection.

The voice controller 2 includes a voice recognizing section 5, an information processing section 6, and a voice generating section 7 as software. A sound source data section 8 is connected to the voice generating section 7. Each of the voice recognizing section 5, the information processing section 6, and the voice generating section 7 is realized in such a manner that the processor performs calculation processing by using the volatile memory based on the voice program stored in the non-volatile memory.

The voice recognizing section 5 recognizes voice which is uttered by the driver and input from the voice input device 3. Then, the voice recognizing section 5 digitizes the voice as text. In voice recognition of the voice recognizing section 5, a known voice recognition technique is used. To be specific, the voice recognizing section 5 converts features (for example, the frequency characteristics) of the voice, input from the voice input device 3, into phonemes by using an acoustic model and converts a combination of the phonemes into text (input text) by using a language model (for example, a word dictionary and a grammar dictionary).

The information processing section 6 subjects the input text, recognized by the voice recognizing section 5, to predetermined processing to generate output text (response text). For example, the information processing section 6 provides a conversational function. Specifically, the information processing section 6 subjects the input text to syntactic analysis and then subjects the input text to semantic analysis. After that, the information processing section 6 refers to a conversation engine having a decision rule of the output text with respect to the input text and outputs the output text most suitable for the meaning of the input text.

The information processing section 6 may subject vehicle information based on below-described CAN information, vehicle information based on information of a sensor mounted on the vehicle other than the CAN information, positional information of a GPS sensor 14 and the like, navigation information, map information, weather information, and the like to predetermined processing and generate the output text before the utterance of the driver. As above, the timing of the voice generation of the information processing section 6 may be any predetermined timing.

The FIGURE shows that the information processing section 6 is realized by the voice controller 2. However, the information processing section 6 may be realized by an external computer (server) connected to the voice controller 2 through a communication network (for example, the Internet). To be specific, the input text recognized by the voice recognizing section 5 may be transmitted to the external computer through the communication network, and the external computer may perform predetermined processing to generate the output text. Then, the generated output text may be transmitted to the voice controller 2 through the communication network to be input to the voice generating section 7. Similarly, each of the voice recognizing section 5 and the voice generating section 7 may be realized by the voice controller 2 or may be realized by an external computer.

The voice generating section 7 converts the output text, input from the information processing section 6, into sound to generate the voice and makes the voice output device 4 output the generated voice. As above, when the utterance (input voice) of the driver is input to the voice input device 3, the response voice (output voice) is output from the voice output device 4 to the ears of the driver after the utterance (input voice) of the driver is processed by the voice recognizing section 5, the information processing section 6, and the voice generating section 7. Therefore, processing time of the voice recognizing section 5 and processing time of the information processing section 6 are required in a period from the voice input to the voice input device 3 until the voice output from the voice output device 4, and this may cause the response delay of the voice generation. For example, since the content of the voice input from the driver is analyzed or understood, or information appropriate as the voice output is searched or extracted, the response delay of the voice generation may be caused.

Therefore, as described below in detail, the voice controller 2 has a function which enables the driver to easily recognize the voice and/or information indicated by the voice.

The voice controller 2 is communicably connected by the I/O interface to a vehicle control device (ECU; not shown) mounted on the motorcycle. In the present embodiment, the I/O interface of the voice controller 2 and the vehicle control device are provided with respective wireless transceivers, and the transmission and reception of information can be performed between the voice controller 2 and the vehicle control device through the wireless transceivers. For example, the voice controller 2 can acquire, through the wireless transceiver, detected values of various sensors provided at the motorcycle and operating command values of actuators provided at the motorcycle. In the present embodiment, various electrical components (for example, actuators, sensors, and control devices) mounted on the motorcycle are connected to each other by a bus connection circuit complying with a CAN communication standard that is an in-vehicle communication network. The wireless transceiver mounted on the motorcycle is interposed on and connected to the bus connection circuit. With this, the CAN information that is information transmitted and received by the bus connection circuit of the motorcycle can also be transmitted to the voice controller 2. For example, the wireless transceivers are configured so as to comply with a standard corresponding to Bluetooth (trademark), and with this, can transmit or receive information each other.

An accelerator sensor 11, an engine rotational speed sensor 12, a vehicle speed sensor 13, the GPS sensor 14, a map information database 15, and a weather information acquiring device 16 are connected to the input side of the voice controller 2. The accelerator sensor 11, the engine rotational speed sensor 12, and the vehicle speed sensor 13 are mounted on the motorcycle and connected to the voice controller 2 through the CAN. The GPS sensor 14 may be mounted on the motorcycle or may be mounted on the mobile information terminal (voice controller 2). The map information database 15 and the weather information acquiring device 16 may be mounted on the motorcycle, may be mounted on the mobile information terminal (voice controller 2), or may be mounted on an external computer connected through the communication network.

The accelerator sensor 11 detects an operation amount of an accelerator of the motorcycle operated by the driver. To be specific, the accelerator sensor 11 detects an accelerator operation amount as operation information related to a vehicle operation of the driver. The engine rotational speed sensor 12 detects the rotational speed of an engine of the motorcycle. It should be noted that when a prime mover of the motorcycle is an electric motor, the engine rotational speed sensor 12 may be a rotational speed sensor which detects the rotational speed of the electric motor, and the voice controller 2 may not refer to a detection signal of the rotational speed sensor. The vehicle speed sensor 13 detects traveling speed of the motorcycle, and for example, detects the rotational speed of a driven wheel of the motorcycle.

The GPS sensor 14 detects the position of the motorcycle by utilizing the GPS (Global Positioning System). The map information database 15 contains map information and information indicating a relation between positions on the map and the existence of noise related objects (for example, expressways, tunnels, stone pavements, and gravel roads). The weather information acquiring device 16 acquires weather information from an external information source (for example, a weather information server) through the communication network. The weather information indicates a relation between positions on the map and types of weather.

The voice controller 2 further includes a location noise acquiring section 17, a noise estimating section 18, and a voice control section 19 as software. Each of the location noise acquiring section 17, the noise estimating section 18, and the voice control section 19 is realized in such a manner that the processor performs calculation processing by using the volatile memory based on the voice program stored in the non-volatile memory.

Based on the information received from the GPS sensor 14, the map information database 15, and the weather information acquiring device 16, the location noise acquiring section 17 calculates noise generation information of a location where the motorcycle travels. For example, the location noise acquiring section 17 collates an own position, detected by the GPS sensor 14, with the map information database 15 to determine whether or not the noise related object exists at the own position on the map and on a route extending from the own position. When it is determined that the noise related object exists, the location noise acquiring section 17 determines a noise state (for example, the level of the noise or the frequency characteristic of the noise) corresponding to the noise related object (for example, the expressway, the tunnel, the stone pavement, or the gravel road) based on a predetermined rule (for example, a correspondence table) and outputs the noise state to the noise estimating section 18.

Based on information related to a generation factor of driving noise generated by the motorcycle itself, a generation factor of traveling noise generated when the motorcycle travels, and a generation factor of environmental noise generated around the motorcycle, the noise estimating section 18 estimates the state (for example, the level or the frequency characteristic) of the noise felt by the driver of the motorcycle. It should be noted that the generation factor of the noise does not denote the noise itself to be detected but denotes a factor which influences the generation of the noise.

Examples of the generation factor of the driving noise generated by the motorcycle itself include an increase in the accelerator operation amount of the driver and an increase in the engine rotational speed. Examples of the generation factor of the traveling noise generated when the motorcycle travels include an increase in the traveling speed of the motorcycle. Examples of the generation factor of the environmental noise generated around the motorcycle includes changes in surrounding environments around the motorcycle, i.e., changes in road surface states (for example, the stone pavement and the gravel road), the existence of tunnels and expressways, the sound of other vehicles traveling around the motorcycle, and the sound of rainfall.

Specifically, the noise estimating section 18 estimates the noise state based on information output from the accelerator sensor 11, the engine rotational speed sensor 12, the vehicle speed sensor 13, and the location noise acquiring section 17. The noise estimating section 18 may refer to a time change (an increase tendency or a decrease tendency) of the accelerator operation amount, detected by the accelerator sensor 11, to estimate whether moving machine driving noise (for example, engine intake sound, combustion explosion sound, exhaust sound, gear collision sound, or vehicle body vibration sound generated by engine vibration) increases or decreases in the near future, whether or not the traveling noise (wind noise) generated when the motorcycle travels increases or decreases in the near future, or the like. To be specific, based on the operation information of the driver, the noise estimating section 18 can estimate a change in the noise, such as the driving noise generated by the motorcycle itself or the traveling noise generated when the motorcycle travels, in advance.

The moving machine driving noise is sound generated by the moving machine itself as long as the engine is driving even when the vehicle is in a stop state. Generally, the moving machine driving noise is proportional to the engine rotational speed. Therefore, the noise estimating section 18 may estimate current engine driving noise from the engine rotational speed, detected by the engine rotational speed sensor 12, based on a predetermined rule (for example, a table showing a correspondence relation between the engine rotational speed and the driving noise). Specifically, the noise estimating section 18 may increase the estimated noise level as the engine rotational speed increases.

The traveling noise (wind noise, road noise, vehicle body vibration sound generated by traveling vibration, etc.) generated when the motorcycle travels is sound generated as long as the motorcycle is traveling even if the engine is in a stop state. Generally, the traveling noise is proportional to the traveling speed of the motorcycle. Therefore, the noise estimating section 18 may estimate current traveling noise from the traveling speed, detected by the vehicle speed sensor 13, based on a predetermined rule (for example, a table showing a correspondence relation between the traveling speed and the traveling noise). Specifically, the noise estimating section 18 may increase the estimated noise level as the traveling speed of the motorcycle increases.

The environmental noise generated around the motorcycle is sound generated by a change in the surrounding environment around the motorcycle. Therefore, the noise estimating section 18 may estimate the environmental noise based on information related to the surrounding environment (for example, a road surface state, the existence of a tunnel or an expressway, sound of other vehicles traveling around the motorcycle, or sound of rainfall). Specifically, the noise estimating section 18 may increase the estimated noise level as the surrounding environment changes such that the environmental noise increases.

The voice control section 19 changes an attribute of the voice, generated by the voice generating section 7, in accordance with the noise state estimated by the noise estimating section 18. Examples of the attribute of the voice include the frequency characteristic, a sentence length, and the timing of the voice output by the voice output device 4. The attribute of the voice is appropriately changed in accordance with the noise. Therefore, even while the noise is being generated, the generated voice information can be made easy to listen for the driver.

For example, as the noise level estimated by the noise estimating section 18 increases, the voice control section 19 changes the frequency characteristic (for example, sound pitch, sound length (speed), or tone) of the voice generated by the voice generating section 7 and adjusts the voice based on Lombard effect such that the voice becomes easy to listen for the driver. Moreover, the voice control section 19 may change the frequency characteristic of the voice, generated by the voice generating section 7, in accordance with the frequency characteristic of the noise estimated by the noise estimating section 18 and adjust the voice such that the voice becomes easy to listen for the driver.

As the noise level estimated by the noise estimating section 18 increases, the voice control section 19 may adjust the sentence length of the voice, generated by the voice generating section 7, so as to shorten the sentence length. According to this, the content indicated by the voice is recognized by the driver more easily than when the sentence length of the voice is long. Moreover, when the noise estimating section 18 predicts a sudden increase in the noise level, the voice control section 19 may suppress the voice output until a decrease in the noise level is predicted. With this, when the noise level is high, the voice output is suppressed, and this can prevent a case where the driver fails to listen to the voice.

When the noise level estimated by the noise estimating section 18 becomes larger than a predetermined value, the voice control section 19 may change the output timing of the voice. To be specific, when the noise level estimated by the noise estimating section 18 becomes larger than the predetermined value, the voice control section 19 may make the voice generating section 7 suspend the output of the voice from the voice output device 4. Then, based on the information calculated by the location noise acquiring section 17, the voice control section 19 may specify a time point at which the noise level is predicted to become less than the predetermined value in the near future. When the time point comes, the voice output which has been suspended by the voice output device 4 may be performed by the voice output device 4. According to this, the driver easily recognizes the voice while maintaining a natural state of the voice quality.

When the noise level becomes the predetermined value or more after the output of the voice is started, the voice output may be terminated or suspended. When the noise level becomes less than the predetermined value, the voice output may be reproduced again or resumed. The predetermined value may be changed in accordance with the importance of the voice to be output. To be specific, the predetermined value may be changed such that: when the importance of the voice to be output is low, the predetermined value is made large (i.e., a threshold is relaxed); and when the importance of the voice to be output is high, the predetermined value is made small (i.e., the threshold is made severe).

According to the above-described configuration, since the noise state is estimated based on the information related to the noise generation factor, the noise state can be predictively known unlike a case where the noise itself is detected. Therefore, even in the case of the motorcycle or the like in which a dynamic change in the noise state is significant, voice mismatch caused by the response delay of the voice generation with respect to the noise is prevented. With this, the driver can easily listen to the voice and therefore can easily recognize the information indicated by the voice. Moreover, since the noise level itself is not actually measured but is estimated based on the information related to the noise generation factor, the driver can easily listen to the voice information even when a sound collecting sensor which actually measures the noise is not provided.

As described above, it is preferable that a future change in the noise state be estimated based on the information related to the noise generation factor. Moreover, it is preferable that the attribute of the voice be changed based on a future time change of the estimated noise state. For example, when it is estimated that a future noise state after the voice generation becomes large by the response delay of the voice generation, the attribute of the voice is changed in consideration of the delay such that the voice becomes easy to listen. A more specific example may be such that: the response time for the voice generation is recognized in advance (for example, the response time is set in advance or measured); when an increase amount of estimated noise per unit time exceeds a predetermined increase threshold, the noise state after the elapse of the response time is estimated to become large; and the attribute of the voice is changed such that the level of the output voice is increased, and therefore, the voice is easy to listen even when there is noise. Another example may be such that: when a decrease amount of estimated noise per unit time exceeds a predetermined decrease threshold, the noise after the elapse of the response time is estimated to become small; and the attribute of the voice is changed such that the level of the output voice is decreased, and therefore, the voice is easy to listen even when there is noise.

In the present embodiment, the information related to the noise generation factor is only required to be information related to a temporal noise change which influences the easiness of listening of the output voice for the driver. For example, when the operation amount of the driver is set as the information related to the noise generation factor, the noise change can be predicted before the noise change influences the actual easiness of listening. For example, since a temporal delay occurs from when the accelerator operation amount is changed until when the engine rotational frequency actually changes, the noise change is predicted before the change in the noise (especially the driving noise of the moving machine) occurs, and the attribute of the voice can be changed in accordance with the prediction. As the operation amount of the driver, information related to operation start, operation termination, and operation time change of brake operation, clutch operation, gear operation, and the like in addition to the accelerator operation amount may be used for the estimation of the noise. According to this, the noise change after the operation is predicted, and the attribute of the voice is easily changed. These operation amounts of the driver can be detected by existing sensors provided at the vehicle.

Moreover, for example, a time change of a vehicle state is set as the information related to the noise generation factor, and with this, the noise change can be predicted before the noise change actually influences the easiness of listening. For example, a time change of the engine rotational frequency can be used as the vehicle state. When the time change of the engine rotational frequency suddenly increases and exceeds a predetermined value, the sudden increase in the noise (especially the driving noise and traveling noise of the moving machine) can be predicted. As above, the sudden noise change may be predicted, and the attribute of the voice may be changed in accordance with the prediction. As the time change of the vehicle state, time changes of a throttle opening degree, a vehicle speed, a front wheel rotational frequency, a rear wheel rotational frequency, acceleration/deceleration, a change gear ratio, and the like may be used in addition to the time change of the engine rotational frequency, i.e., time differential values may be used. With this, the noise change can be predicted, and the attribute of the voice can be changed. These vehicle states can be detected by existing sensors provided at the vehicle.

A future noise change may be predicted based on a traveling path, a traveling speed, and a prestored road surface state, and the attribute of the output voice may be changed in accordance with the prediction. When the vehicle is predicted to enter into a tunnel or the vehicle is predicted to change a route to an expressway, the attribute of the output voice may be changed in accordance with the predicted noise change. For example, the noise (especially, the environmental noise) may be predicted to increase due to the future entering into the tunnel or the future traveling on the expressway, and the attribute of the output voice may be changed such that the voice becomes easy to listen. Moreover, a change in the weather may be predicted, i.e., traveling in rain in the future may be predicted, and the attribute of the output voice may be changed in accordance with this prediction.

In the present embodiment, future driving noise, future traveling noise, and future environmental noise are predicted based on the noise generation factors, and the attribute of the output voice is changed based on the predicted noise. However, the attribute of the output voice may be changed based on at least one of the driving noise, the traveling noise, and the environmental noise. It is preferable that the attribute of the output voice be changed based on the noise generation factors that are two or more of the driving noise, the traveling noise, and the environmental noise. With this, the attribute of the voice can be comprehensively changed based on the noise.

Moreover, by converting a sound pressure level of future noise into a noise value represented by a logarithmic value (decibel), the noise recognized by the driver can be easily determined. Furthermore, by correcting the respective sound frequencies of the output voice in consideration of the easiness of listening for the driver, the noise recognized by the sense of hearing of humans can be further easily determined. By changing the frequency characteristic of the voice in accordance with the noise level, the output voice that is easy to listen for the driver can be generated. It should be noted that in the present embodiment, the attribute of the voice is changed based on the noise level. However, in the present invention, the attribute of the voice may be changed based on a sound index other than the noise level.

Moreover, the motorcycle may further include a sound collecting sensor which measures the noise level. With this, the detection accuracy of the noise level can be improved, and the voice information that is further easy to listen can be provided. The voice controller 2 is only required to perform the voice generation for information transmission to the driver when a predetermined condition is satisfied. Therefore, in the present invention, the voice controller 2 does not have to have a function of recognizing the voice uttered by the driver or a function of communication through a public network. The driver exposed type moving machine denotes such a moving machine that at least the head of the driver is not covered by the body of the vehicle. In addition to the motorcycles, the present invention is suitably applicable to buggy cars, personal watercrafts (PWC), snowmobiles, boats, convertible cars, and the like.

REFERENCE CHARACTERS LIST 1 voice system
17 location noise acquiring section
18 noise estimating section
19 voice control section

The invention claimed is:
1. A voice system of a moving machine driven by a driver who is exposed to an outside of the moving machine, the voice system comprising:
   a noise estimating section which estimates a future noise state based on information related to a noise generation factor; and
   a voice control section which changes an attribute of voice in accordance with the estimated noise state, the voice being voice to be output to the driver, wherein
   the information related to the noise generation factor includes: information related to a generation factor of driving noise generated by the moving machine, or a time change of a state of the moving machine, and the voice control section shortens a sentence length of the voice by modifying an output text of the voice as a noise level estimated by the noise estimating section increases.

2. The voice system according to claim 1, wherein the information related to the noise generation factor further includes information related to at least one of a generation factor of traveling noise generated when the moving machine travels, and a generation factor of environmental noise generated around the moving machine.

3. The voice system according to claim 2, wherein the information related to the noise generation factor is information related to two or more of the generation factor of the driving noise, the generation factor of the traveling noise, and the generation factor of the environmental noise.

4. The voice system according to claim 1, wherein:
the noise estimating section estimates the noise level based on the information related to the noise generation factor; and
the voice control section changes the attribute of the voice in accordance with the estimated noise level.

5. The voice system according to claim 1, wherein:
the noise estimating section estimates a future noise state based on a time change of the noise generation factor; and
the voice control section changes the attribute of the voice in accordance with the estimated future noise level.

6. The voice system according to claim 1, wherein the noise estimating section estimates the noise state based on operation information related to vehicle operation of the driver.

7. The voice system according to claim 2, further comprising a location noise acquiring section which acquires noise generation information of a location where the moving machine travels, wherein
the noise estimating section determines the noise state in accordance with the noise generation information of the location.

8. A voice output method for a moving machine driven by a driver who is exposed to an outside of the moving machine, the voice output method comprising:
estimating a future noise state based on information related to a noise generation factor;
shortening a sentence length of a voice by modifying an output text of the voice as an estimated noise level increases, the voice being voice to be output to the driver, wherein
the information related to the noise generation factor includes: information related to a generation factor of driving noise generated by the moving machine, or a time change of a state of the moving machine.

9. The voice system according to claim 1, wherein the information related to the noise generation factor includes the information related to the generation factor of the driving noise generated by the moving machine.

10. The voice system according to claim 6, wherein the vehicle operation is at least one selected from the group consisting of accelerator operation, brake operation, clutch operation, and gear operation.

11. The voice system according to claim 1, wherein the information related to the noise generation factor includes a time change of the noise generation factor.

12. The voice system according to claim 1, wherein the information related to the noise generation factor includes at least one selected from the group consisting of a time change of an engine rotational frequency, a time change of a throttle opening degree, a vehicle speed, a front wheel rotational frequency, a rear wheel rotational frequency, acceleration, deceleration, and a change gear ratio.

13. The voice system according to claim 1, wherein
when a noise level estimated by the noise estimating section becomes a predetermined value or more after the output of the voice is started, the voice output is suspended, and
when the noise level estimated by the noise estimating section becomes less than the predetermined value, the voice output is resumed.

14. The voice system according to claim 13, wherein the predetermined value is changed in accordance with an importance of the voice to be output.

15. A voice system of a moving machine driven by a driver who is exposed to an outside of the moving machine, the voice system comprising:
a noise estimating section which estimates a future noise state based on information related to a noise generation factor; and
a voice control section which changes an attribute of voice in accordance with the estimated noise state, the voice being voice to be output to the driver, wherein
the voice control section determines a sentence length of the voice as the attribute in accordance with the estimated noise state, and
the voice control section shortens the sentence length of the voice by modifying an output text of the voice as a noise level estimated by the noise estimating section increases.

16. A voice system of a moving machine driven by a driver who is exposed to an outside of the moving machine, the voice system comprising:
a noise estimating section which estimates a future noise state based on information related to a noise generation factor; and
a voice control section which changes an attribute of voice in accordance with the estimated noise state, the voice being voice to be output to the driver, wherein
when a noise level estimated by the noise estimating section becomes a predetermined value or more after the output of the voice is started, the voice output is suspended,
when the noise level estimated by the noise estimating section becomes less than the predetermined value, the voice output is resumed, and
the voice control section shortens a sentence length of the voice by modifying an output text of the voice as the noise level estimated by the noise estimating section increases.

* * * * *